United States Patent
Kamata et al.

(10) Patent No.: US 10,491,183 B2
(45) Date of Patent: *Nov. 26, 2019

(54) POWER FEEDING DEVICE AND WIRELESS POWER FEEDING SYSTEM

(71) Applicant: SEMICONDUCTOR ENERGY LABORATORY CO., LTD., Atsugi-shi, Kanagawa-ken (JP)

(72) Inventors: Koichiro Kamata, Kanagawa (JP); Shinya Okano, Kanagawa (JP); Misako Sato, Kanagawa (JP); Shuhei Maeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 92 days.

This patent is subject to a terminal disclaimer.

(21) Appl. No.: 15/825,405

(22) Filed: Nov. 29, 2017

(65) Prior Publication Data

US 2018/0091113 A1 Mar. 29, 2018

Related U.S. Application Data

(63) Continuation of application No. 14/680,169, filed on Apr. 7, 2015, now Pat. No. 9,837,977, which is a
(Continued)

(30) Foreign Application Priority Data

Jan. 20, 2011 (JP) .................................. 2011-009685

(51) Int. Cl.
*H03H 7/38* (2006.01)
*H02J 50/12* (2016.01)
(Continued)

(52) U.S. Cl.
CPC ............... *H03H 7/38* (2013.01); *H01F 38/14* (2013.01); *H02J 5/005* (2013.01); *H02J 7/025* (2013.01);
(Continued)

(58) Field of Classification Search
CPC .. H03H 7/38; H02J 50/80; H02J 50/40; H02J 5/005; H02J 7/025; H02J 50/12; H01F 38/14; H03C 1/36; H03D 1/02
See application file for complete search history.

(56) References Cited

U.S. PATENT DOCUMENTS 5,124,699 A 6/1992 Tervoert et al.
5,428,521 A 6/1995 Kigawa et al.
(Continued)

FOREIGN PATENT DOCUMENTS

EP 2357717 A 8/2011
EP 2571140 A 3/2013
(Continued)

OTHER PUBLICATIONS

Kurs.A et al., "Wireless Power Transfer via Strongly Coupled Magnetic Resonances", Science, Jul. 6, 2007, vol. 317, No. 5834, pp. 83-86.
(Continued)

*Primary Examiner* — Robert L Deberadinis
(74) *Attorney, Agent, or Firm* — Nixon Peabody LLP; Jeffrey L. Costellia

(57) ABSTRACT

A resonant power feeding system that can provide high power transmission efficiency between a power feeding device and a power reception device without dynamically controlling the oscillation frequency in accordance with the distance between the power feeding device and the power reception device. High power transmission efficiency between the power feeding device and the power reception
(Continued)

device is obtained by addition of a structure for adjusting the matching condition to both the power reception device and the power feeding device. Specifically, a transmission-reception circuit and a matching circuit are provided in both the power reception device and the power feeding device, and wireless signals for adjusting the matching circuit are transmitted and received through a resonant coil. Thus, the power feeding device can efficiently supply power to the power reception device without adjusting the oscillation frequency.

6 Claims, 10 Drawing Sheets

Related U.S. Application Data continuation of application No. 13/352,383, filed on Jan. 18, 2012, now Pat. No. 9,024,482.

(51) Int. Cl.
*H02J 50/80* (2016.01)
*H02J 50/40* (2016.01)
*H02J 7/02* (2016.01)
*H01F 38/14* (2006.01)
*H03C 1/36* (2006.01)
*H03D 1/02* (2006.01)
*H02J 5/00* (2016.01)

(52) U.S. Cl.
CPC ............. *H02J 50/12* (2016.02); *H02J 50/40* (2016.02); *H02J 50/80* (2016.02); *H03C 1/36* (2013.01); *H03D 1/02* (2013.01)

(56) References Cited

U.S. PATENT DOCUMENTS

| | | | |
|---|---|---|---|
| 5,652,423 A | 7/1997 | Saitoh et al. | |
| 5,790,946 A | 8/1998 | Rotzoll | |
| 6,509,217 B1 | 1/2003 | Reddy | |
| 6,737,302 B2 | 5/2004 | Arao | |
| 6,837,438 B1 | 1/2005 | Takasugi et al. | |
| 7,180,421 B2 | 2/2007 | Pahlaven et al. | |
| 7,209,771 B2 | 4/2007 | Twitchell, Jr. | |
| 7,301,830 B2 | 11/2007 | Takahashi et al. | |
| 7,394,382 B2 | 7/2008 | Nitzan et al. | |
| 7,675,358 B2 | 3/2010 | Atsumi | |
| 7,907,902 B2 | 3/2011 | Kato et al. | |
| 8,064,825 B2 | 11/2011 | Onishi et al. | |
| 8,134,256 B2 | 3/2012 | Onishi et al. | |
| 8,160,636 B2 | 4/2012 | Tadokoro | |
| 8,160,654 B2 | 4/2012 | Onishi et al. | |
| 8,217,535 B2 | 7/2012 | Uchida et al. | |
| 8,334,619 B2 | 12/2012 | Takei | |
| 8,369,905 B2 | 2/2013 | Sogabe et al. | |
| 8,406,823 B2 | 3/2013 | Kondo et al. | |
| 8,461,719 B2 | 6/2013 | Kesler et al. | |
| 8,716,977 B2 | 5/2014 | Walley et al. | |
| 8,855,554 B2 | 10/2014 | Cook et al. | |
| 9,024,482 B2 * | 5/2015 | Kamata .................. | H02J 7/025 307/104 |
| 2002/0049714 A1 | 4/2002 | Yamazaki et al. | |
| 2003/0017804 A1 | 1/2003 | Heinrich et al. | |
| 2003/0104848 A1 | 6/2003 | Brideglall | |
| 2004/0077383 A1 | 4/2004 | Lappetelainen et al. | |
| 2004/0128246 A1 | 7/2004 | Takayama et al. | |
| 2004/0131897 A1 | 7/2004 | Jenson et al. | |
| 2004/0145454 A1 | 7/2004 | Powell et al. | |
| 2005/0020321 A1 | 1/2005 | Rotzoll | |
| 2005/0215119 A1 | 9/2005 | Kaneko | |
| 2005/0254183 A1 | 11/2005 | Ishida et al. | |
| 2006/0009251 A1 | 1/2006 | Noda et al. | |
| 2006/0044726 A1 | 3/2006 | Sakata et al. | |
| 2007/0216348 A1 | 9/2007 | Shionoiri et al. | |
| 2007/0229228 A1 | 10/2007 | Yamazaki et al. | |
| 2007/0229271 A1 | 10/2007 | Shionoiri et al. | |
| 2007/0229279 A1 | 10/2007 | Yamazaki et al. | |
| 2007/0229281 A1 | 10/2007 | Shionoiri et al. | |
| 2007/0278998 A1 | 12/2007 | Koyama | |
| 2007/0285246 A1 | 12/2007 | Koyama | |
| 2008/0285199 A1 | 11/2008 | Deutschmann et al. | |
| 2009/0325651 A1 | 12/2009 | Kondo et al. | |
| 2010/0052431 A1 | 3/2010 | Mita | |
| 2010/0244577 A1 | 9/2010 | Shimokawa | |
| 2010/0244580 A1 | 9/2010 | Uchida et al. | |
| 2010/0244839 A1 | 9/2010 | Yoshikawa | |
| 2010/0259109 A1 | 10/2010 | Sato | |
| 2010/0289449 A1 | 11/2010 | Elo | |
| 2011/0049995 A1 | 3/2011 | Hashiguchi | |
| 2011/0080053 A1 | 4/2011 | Urano | |
| 2011/0095619 A1 | 4/2011 | Urano | |
| 2011/0101791 A1 | 5/2011 | Urano | |
| 2011/0140537 A1 | 6/2011 | Takei | |
| 2011/0169337 A1 | 7/2011 | Kozakai | |
| 2011/0241440 A1 | 10/2011 | Sakoda et al. | |
| 2011/0248572 A1 | 10/2011 | Kozakai et al. | |
| 2011/0270462 A1 | 11/2011 | Amano et al. | |
| 2011/0309689 A1 | 12/2011 | Kamata | |
| 2012/0032521 A1 | 2/2012 | Inoue et al. | |
| 2012/0109256 A1 | 5/2012 | Meskins et al. | |
| 2012/0133212 A1 | 5/2012 | Kamata | |
| 2012/0161536 A1 | 6/2012 | Kamata et al. | |
| 2013/0193913 A1 | 8/2013 | Takada et al. | |
| 2013/0240877 A1 | 9/2013 | Nishijima | |
| 2013/0342025 A1 | 12/2013 | Cook et al. | |

FOREIGN PATENT DOCUMENTS

| | | |
|---|---|---|
| JP | 06-006272 A | 1/1994 |
| JP | 10-285087 A | 10/1998 |
| JP | 11-088243 A | 3/1999 |
| JP | 2002-259921 A | 9/2002 |
| JP | 2003-085506 A | 3/2003 |
| JP | 2005-063123 A | 3/2005 |
| JP | 2006-180073 A | 7/2006 |
| JP | 2007-183790 A | 7/2007 |
| JP | 2010-068657 A | 3/2010 |
| JP | 2010-130800 A | 6/2010 |
| JP | 2010-141966 A | 6/2010 |
| JP | 2010-141976 A | 6/2010 |
| JP | 2010-141977 A | 6/2010 |
| JP | 2010-193598 A | 9/2010 |
| JP | 2010-239690 A | 10/2010 |
| JP | 2010-252446 A | 11/2010 |
| JP | 2010-252468 A | 11/2010 |
| JP | 2010-252497 A | 11/2010 |
| JP | 2010-268665 A | 11/2010 |
| JP | 2010-284006 A | 12/2010 |
| JP | 2010-284066 A | 12/2010 |
| JP | 2011-120410 A | 6/2011 |
| JP | 2011-121456 A | 6/2011 |
| JP | 2011-125184 A | 6/2011 |
| JP | 2011-130614 A | 6/2011 |
| JP | 2011-135717 A | 7/2011 |
| JP | 2011-142769 A | 7/2011 |
| WO | WO-2009/111597 | 9/2009 |
| WO | WO-2011/142417 | 11/2011 |

OTHER PUBLICATIONS

Korean Office Action (Application No. 2011-0144729) dated Apr. 13, 2018.

* cited by examiner

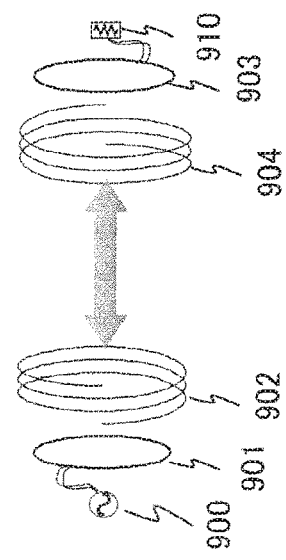 FIG. 8A1
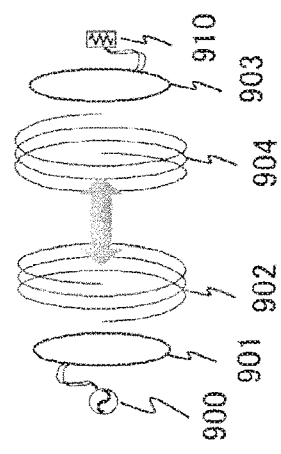 FIG. 8B1
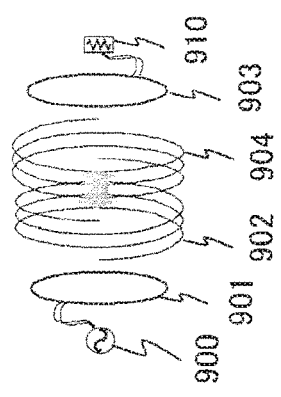 FIG. 8C1
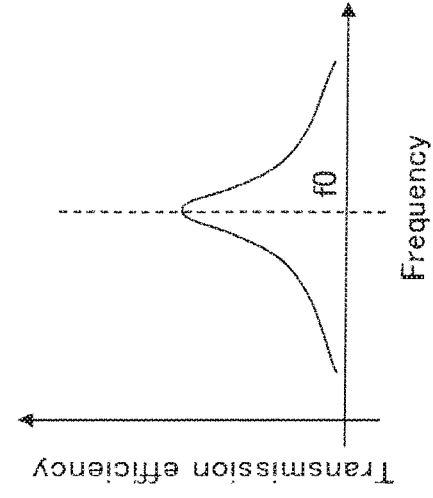 FIG. 8A2
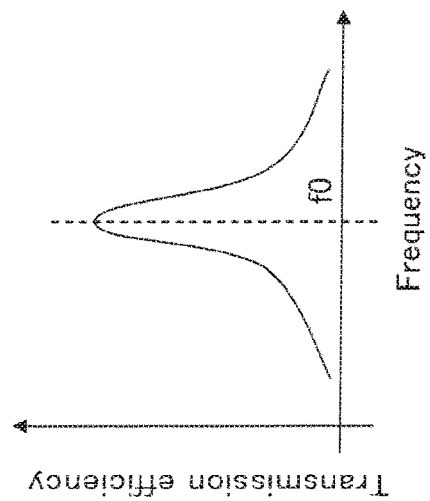 FIG. 8B2
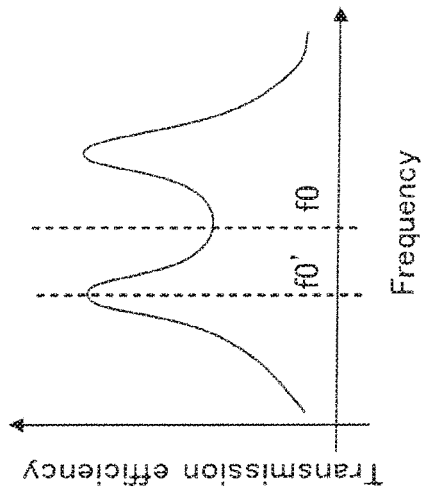 FIG. 8C2

POWER FEEDING DEVICE AND WIRELESS POWER FEEDING SYSTEM

BACKGROUND OF THE INVENTION

1. Field of the Invention

The present invention relates to power feeding devices and wire less power feeding systems including the power feeding devices.

2. Description of the Related Art

A variety of electronic devices have spread, and a wide range of products are shipped to the market. In recent years, portable electronic devices such as mobile phones and digital video cameras have spread widely. Further, electric propulsion vehicles that are powered by electric power, such as electric cars, are coming on the market as products.

Mobile phones, digital video cameras, and electric propulsion vehicles include batteries which are energy storage means. At the moment, the batteries are charged in most cases by being directly connected to home AC sources which are power feeding means. Other devices that have no battery or do not use power charged in a battery are directly supplied with power from a home AC source through a wiring or the like.

On the other hand, methods by which batteries are charged wirelessly or power is transmitted to loads wirelessly have been researched and developed. Typical methods are an electromagnetic induction method (also referred to as an electromagnetic coupling method), a radio wave method (also referred to as a microwave method), and a resonance method. An electromagnetic induction method comes into wide use for some electronic device, such as small consumer electronics.

A resonant wireless power feeding system has attracted attention since it provides high transmission efficiency at middle and long distance. In the resonant wireless power feeding system, however, it is known that the power transmission efficiency changes enormously depending on the distance between a resonant coil included in a device that receives power (hereinafter "power reception device") and a resonant coil included in a device that supplies power (hereinafter "power feeding device"). For that reason, structures for maintaining high transmission efficiency even when the distance between the power reception device and the power feeding device is changed have been actively researched and developed (e.g., see Patent Documents 1 and 2).

REFERENCE

Patent Document 1: Japanese Published Patent Application No. 2010-252468
Patent Document 2: Japanese Published Patent Application No. 2010-239690

SUMMARY OF THE INVENTION

A resonant wireless power feeding system will be described using schematic diagrams. FIGS. 8A1, 8B1, and 8C1 are schematic diagrams illustrating a first coil 901 and a first resonant coil 902 in a power feeding device and a second coil 903 and a second resonant coil 904 in a power reception device; these coils are positioned between a high frequency power source 900 and a load 910. FIGS. 8A1, 8B1, and 8C1 schematically show the distance between the first resonant coil 902 in the power feeding device and the second resonant coil 904 in the power reception device. FIG. 8A1 shows a state where these resonant coils are placed at a distance less than the optimal distance for resonance. FIG. 8B1 shows a state where the resonant coils are placed at the optimal distance for resonance. FIG. 8C1 shows a state where the resonant coils are placed at a distance greater than the optimal distance for resonance.

FIGS. 8A2, 8B2, and 8C2 are graphs showing dependence of transmission efficiency between the power feeding device and the power reception device on oscillation frequency of the high frequency power source 900, which correspond to FIGS. 8A1, 8B1, and 8C1. Note that the frequency f0 in the graphs is the resonant frequency of the resonant coils.

When the first resonant coil 902 and the second resonant coil 904 are placed at the optimal distance for resonance as shown in FIG. 8B1, the power transmission efficiency is at the maximum with the frequency f0 as shown in FIG. 8B2. When the first resonant coil 902 and the second resonant coil 904 are placed at distance less than the optimal distance for resonance as shown in FIG. 8A1, the peak of the power transmission efficiency is split and the efficiency reaches its peak with the frequency f0' as shown in FIG. 8A2. The frequency f0 in FIG. 8A2 is in the valley between the two peaks, which means that the power transmission efficiency is decreased with the frequency f0. When the first resonant coil 902 and the second resonant coil 904 are placed at distance greater than the optimal distance for resonance as shown in FIG. 8C1, peak splitting does not occur in FIG. 8C2 but the power transmission efficiency with the resonant frequency f0 is lower than that in FIG. 8B2.

Consequently, in order to provide high power transmission efficiency between the power feeding device and the power reception device, it is important to adjust the oscillation frequency of the high frequency power source in the power feeding device to match a frequency at which the power transmission efficiency is at the maximum and which depends on the distance between the power feeding device and the power reception device as seen from FIGS. 8A1, 8A2, 8B1, 8B2, 8C1, and 8C2. However, a control means is needed for a high frequency power source in order to control the oscillation frequency dynamically in accordance with the distance between the power feeding device and the power reception device. This leads to the increase in size and cost of the device.

In view of the above, an object of one embodiment of the present invention is to provide a resonant power feeding system that can provide high power transmission efficiency between a power feeding device and a power reception device without dynamically controlling the oscillation frequency in accordance with the distance between the power feeding device and the power reception device.

According to one embodiment of the present invention, high power transmission efficiency between a power feeding device and a power reception device is obtained by addition of a structure for adjusting the matching condition in both the power reception device and the power feeding device. Specifically, in one embodiment of the present invention, a transmission-reception circuit and a matching circuit are provided in both the power reception device and the power feeding device, and wireless signals for adjusting the matching circuit are transmitted and received through a resonant coil. Thus, the power feeding device can efficiently supply power to the power reception device without adjusting the oscillation frequency.

According to one embodiment of the present invention, a power feeding device includes a first resonant coil resonating with a second resonant coil electromagnetically coupled to a second coil in a power reception device; a first coil electromagnetically coupled to the first resonant coil; a transmission-reception circuit including a modulation circuit configured to modulate an alternating-current signal output from a high frequency power source in order to superimpose a data signal on the alternating-current signal to produce a first wireless signal, and a demodulation circuit configured to demodulate a second wireless signal received by the first coil from the power reception device; a matching circuit configured to match impedance between the high frequency power source side and the first coil side; and a control circuit configured to control the matching circuit in accordance with a power value detected by the power reception device and included in the second wireless signal received by the first coil, and to generate a data signal of the first wireless signal superimposed on the alternating-current signal.

According to one embodiment of the present invention, a wireless power feeding system includes a power feeding device and a power reception device. The power feeding device includes a first resonant coil; a first coil electromagnetically coupled to the first resonant coil; a first transmission-reception circuit including a modulation circuit configured to modulate an alternating-current signal output from a high frequency power source in order to superimpose a data signal on the alternating-current signal to produce a first wireless signal, and a demodulation circuit configured to demodulate a second wireless signal received by the first coil from the power reception device; a first matching circuit configured to match impedance between the high frequency power source side and the first coil side; and a first control circuit configured to control the first matching circuit in accordance with a power value detected by the power reception device from the second wireless signal received by the first coil, and to generate a data signal of the first wireless signal superimposed on the alternating current signal. The power reception device includes a second resonant coil receiving the first wireless signal from the power feeding device by resonating with the first resonant coil; a second coil electromagnetically coupled to the second resonant coil: a second transmission-reception circuit including a modulation circuit configured to modulate the first wireless signal received by the second resonant coil, and a demodulation circuit configured to generate the second wireless signal to be transmitted to the first resonant coil; a second matching circuit configured to match impedance between the rectifier circuit side and the second coil side; a received power detection circuit configured to detect a power obtained from the first wireless signal received by the second coil; and a second control circuit configured to control the second matching circuit in accordance with the data signal superimposed on the first wireless signal and received by the second coil, and to control the second transmission-reception circuit so as to generate the second wireless signal in accordance with the power value detected by the received power detection circuit.

One embodiment of the present invention can provide a resonant power feeding system that can provide high power transmission efficiency between a power feeding device and a power reception device without dynamically controlling the oscillation frequency in accordance with the distance between the power feeding device and the power reception device.

BRIEF DESCRIPTION OF THE DRAWINGS

In the accompanying drawings:
FIGS. 8A1, 8A2, 8B1, 8B2, 8C1, and 8C2 are diagrams and graphs for explaining an object.

DETAILED DESCRIPTION OF THE INVENTION

Figure 1:
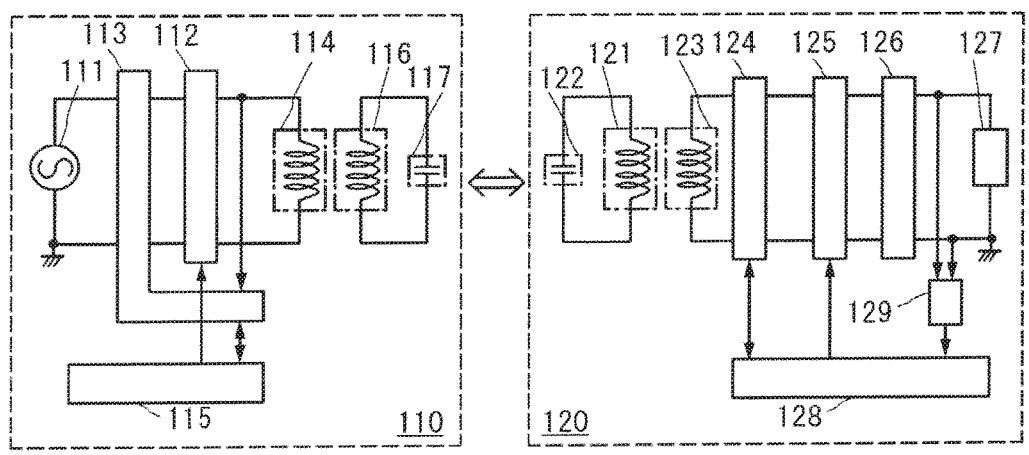
FIG. 1 illustrates a structure in Embodiment 1.

Embodiments of the present invention will be described below with reference to the accompanying drawings. Note that the present invention can be carried out in many different modes, and it is easily understood by those skilled in the art that modes and details of the present invention can be modified in various ways without departing from the spirit and scope of the present invention. Therefore, the present invention should not be construed as being limited to the following description of the embodiments. Note that in structures of the present invention described below, reference numerals denoting the same portions are used in common in different drawings.

Note that the size of components, the thickness of layers, and signal waveform illustrated in the drawings and the like in the embodiments are exaggerated for simplicity in some cases. Therefore, the scale is not necessarily limited to that illustrated in the drawings and the like.

Note that in this specification, the terms "first" to "n-th" (n is a natural number) are used in order to avoid confusion between components and thus do not limit the number of the components.

Embodiment 1

In this embodiment, a resonant wireless power feeding system according to one embodiment of the present invention will be described.

FIG. 1 is a block diagram of a power feeding device and a power reception device. FIG. 1 illustrates power transmission with an electromagnetic field using resonance of a first resonant coil in the power feeding device and a second resonant coil in the power reception device. In the block diagram in FIG. 1, circuits in the power feeding device and the power reception device are classified according to their functions and shown as independent units. Note that it is difficult to completely separate circuits in accordance with functions in an actual power feeding device and an actual power reception device. It is possible that one circuit has a plurality of functions or a plurality of circuits achieve a function corresponding to one unit.

A power feeding device 110 includes a high frequency power source 111, a first matching circuit 112, a first transmission-reception circuit 113, a first coil 114, a first control circuit 115, a first resonant coil 116, and a first resonant capacitor 117.

A power reception device 120 includes a second resonant coil 121, a second resonant capacitor 122, a second coil 123, a second transmission-reception circuit 124, a second matching circuit 125, a rectifier circuit 126, a load 127, a second control circuit 128, and a circuit 129 for detecting received power (hereinafter "received power detection circuit").

The high frequency power source 111 is a power source circuit for outputting it alternating-current signal based on a frequency (resonant frequency of the first and the second resonant coils) for transmitting power between the power feeding device and the power reception device by a resonance method.

There is no particular limitation on the frequency (oscillation frequency) of an alternating-current signal output from the high frequency power source 111 in the power feeding device 110 in this embodiment, and the oscillation frequency can be any frequency as long as power can be transmitted from the power feeding device 110 to the power reception device 120 by a resonance method. The oscillation frequency in a resonance method can be used in the frequency range several kilohertz to several gigahertz, for example.

The first matching circuit 112 is connected to the high frequency power source 111 through the first transmission-reception circuit 113 and connected to the first coil 114. The first matching circuit 112 includes at least one element that can adjust the impedance and is connected in series and/or in parallel with the high frequency power source 111. Note that the element that can adjust the impedance refers to a variable capacitor or a variable coil. The operation of the first matching circuit 112 is controlled by the first control circuit 115 so as to match the impedance between the high frequency power source 111 side, which is the input side, and the first coil 114 side, which is the output side.

The first transmission-reception circuit 113 is connected to the high frequency power source 111 and the first coil 114. The first transmission-reception circuit 113 has a function of generating a first wireless signal transmitted from the first coil 114 by modulating an alternating-current signal output from the high frequency power source 111, and a function of demodulating a second wireless signal received by the first coil 114. For the modulation function, a mixer circuit may be provided on the high frequency power source 111 side. The mixer circuit is a circuit that modulates the amplitude, phase, frequency, or the like of an alternating-current signal output from the high frequency power source, in accordance with an inventory signal, a data signal, or a signal for requesting the power reception device 120 to send hack the power value received by the power reception device 120 to the power feeding device 110, or the like. For the demodulation function, a detector circuit, an amplifier circuit, and a rectifier circuit may be provided on the first coil 114 side.

Figure 10A:
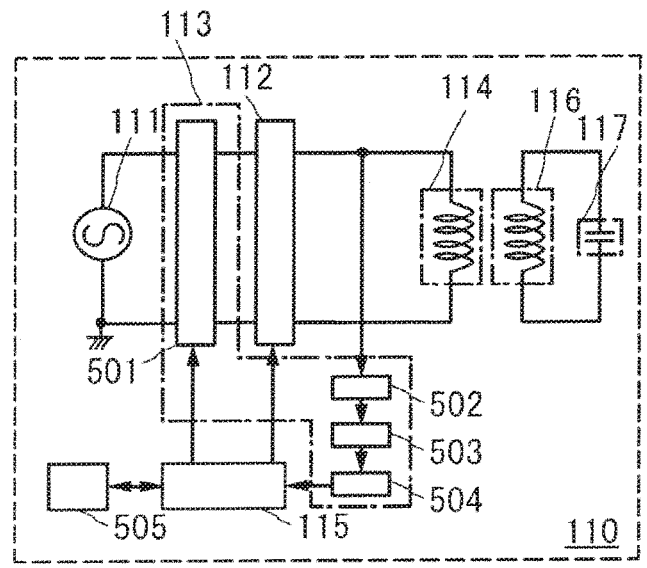
FIGS. 10A and 10B each illustrate a structure in Embodiment 1.

FIG. 10A is a diagram that specifically illustrates the unit of the first transmission-reception circuit 113 in FIG. 1. In the first transmission-reception circuit 113 in FIG. 10A, a mixer circuit 501 serving as a modulation circuit is provided on the high frequency power source 111 side. Moreover, in the first transmission-reception circuit 113 in FIG. 10A, a detector circuit 502, an amplifier circuit 503, and a rectifier circuit 504 that serve as a demodulation circuit are provided on the first coil 114 side.

The first wireless signal is a wireless signal transmitted from the power feeding device 110 to the power reception device 120 and is obtained by modulation of an alternating-current signal for power feeding. The first wireless signal is a wireless signal capable of superimposing an inventory signal for requesting a response of the power reception device 120, a signal for requesting the power reception device 120 to send back the power value received by the power reception device 120 to the power feeding device 110, a data signal, or the like. In addition, the second wireless signal is a wireless signal transmitted from the power reception device 120 to the power feeding device 110 and is obtained by applying load modulation to an alternating-current signal for power feeding. The second wireless signal is a wireless signal capable of superimposing a signal for responding to an inventory signal transmitted from the power feeding device 110, a signal on the value of power received by the power reception device 120, a signal for responding to reception of a data signal by the power reception device 120, or the like. Note that the inventory signal is a signal for the power feeding device 110 to confirm the presence of the power reception device 120.

The first coil 114 is connected to the high frequency power source 111 through the first matching circuit 112 and the first transmission-reception circuit 113. It is preferable that the first coil 114 be electromagnetically coupled to the first resonant coil 116 and made by winding a wire. The first coil 114 in the power feeding device 110 has higher design flexibility than the second coil 123 in the power reception device 120 because the position of the power feeding device 110 is less restricted than the position of the power reception device 120.

The first control circuit 115 is a circuit for controlling the first matching circuit 112 in accordance with a signal that is related to the value of power received by the power reception device 120 and superimposed on the second wireless signal received by the first transmission-reception circuit 113, and for outputting a data signal that is transmitted from the first transmission-reception circuit 113 to the power reception device 120 by being superimposed on the first wireless signal. Note that as illustrated in FIG. 10A, the first control circuit 115 inputs and outputs signals to/from a storage circuit 505 that stores a plurality of data signals corresponding to values of power received by the power reception device 120.

The first resonant coil 116 is connected to the first resonant capacitor 117. It is preferable that the first resonant coil 116 be electromagnetically coupled to the first coil 114 and resonate with the second resonant coil 121, and made by winding a wire. Although there is no particular limitation on the shape of the first resonance coil 116, the first resonant coil 116 in the power feeding device 110 has higher design flexibility than the second resonant coil 121 in the power reception device 120 because the position of the power feeding device 110 is less restricted than the position of the power reception device 120. In particular, the first resonance coil 116 preferably has a high Q factor, and specifically the Q factor is preferably 100 or higher. As an example, the following signals are transmitted and received wirelessly through electromagnetic coupling between the first coil 114 and the first resonant coil 116; as the first wireless signal, an inventory signal for requesting a response of the power reception device 120, a signal for requesting the power reception device 120 to send back the power value received by the power reception device 120 to the power feeding device 110, a data signal, or the like; as the second wireless signal, a signal for responding to an inventory signal transmitted from the power feeding device 110, a signal on the value of power received by the power reception device 120, a signal for responding to reception of a data signal by the power reception device 120, or the like. Further, as an example, the following signals are transmitted and received wirelessly through resonant inductive coupling, between the first resonant coil 116 and the second resonant coil 121; as the first wireless signal, an inventory signal for requesting a response of the power reception device 120, a signal for requesting the power reception device 120 to send back the power value received by the power reception device 120 to the power feeding device 110, a data signal, or the like; as the second wireless signal, a signal for responding to air inventory signal transmitted from the power feeding device 110, a signal on the value of power received by the power reception device 120, a signal for responding to reception of a data signal by the power reception device 120, or the like. Resonant inductive coupling is of resonance method among wireless power feeding methods, and power can be transmitted over a longer distance than electromagnetic induction with the same coil diameter.

The first resonant capacitor 117 is a capacitor provided to be paired with the first resonant coil 116 such that the desired resonant frequency is obtained. Note that the first resonant capacitor 117 does not need to be provided separately from the first resonant coil 116, and is not necessarily provided when the stray capacitance of the first resonant coil 116 is large enough to replace the first resonant capacitor 117.

The second resonant coil 121 is connected to the second resonant capacitor 122. It is preferable that the second resonant coil 121 be electromagnetically coupled to the second coil 123 and resonate with the first resonant coil 116, and made by winding a wire. Although there is no particular limitation on the shape of the second resonant coil 121, the second resonant coil 121 in the power reception device 120 is preferably designed to be smaller than the first resonant coil 116 in the power feeding device 110 because the reduction in size is demanded more strongly for the power reception device 120 than for the power feeding device 110. In particular, the second resonance coil 121 preferably has a high Q factor, and specifically the Q factor is preferably 100 or higher. As an example, the following signals are transmitted and received wirelessly through electromagnetic coupling between the second coil 123 and the second resonant coil 121: as the first wireless signal, an inventory signal for requesting a response of the power reception device 120, a signal for requesting the power reception device 120 to send back the power value received by the power reception device 120 to the power feeding device 110, a data signal, or the like: as the second wireless signal, a signal for responding to an inventory signal transmitted from the power feeding device 110, a signal on the value of power received by the power reception device 120, a signal for responding to reception of a data signal by the power reception device 120, or the like.

The second coil 123 is connected to the load 127 through the second transmission-reception circuit 124, the second matching circuit 125, and the rectifier circuit 126. It is preferable that the second coil 123 be electromagnetically coupled to the second resonant coil 121 and made by winding a wire. Although there is no particular limitation on the shape of the second coil 123, the second coil 123 in the power reception device 120 is preferably designed to be smaller than the first coil 114 in the power feeding device 110 because the reduction in size is demanded more strongly for the power reception device 120 than for the power feeding device 110.

The second transmission-reception circuit 124 is connected to the load 127 and the second coil 123 through the second matching circuit 125 and the rectifier circuit 126. The second transmission-reception circuit 124 has a function of generating the second wireless signal on which a signal on the value of power received from the power feeding device 110 is superimposed, by applying load modulation to an alternating-current signal from the power feeding device 110 for power feeding; and a function of demodulating the first wireless signal received from the power feeding device 110. For the modulation function, a circuit in which a load modulator and a modulation transistor are connected in series may be provided in parallel with the transmission-reception circuit 124 on the second coil 123 side. For the demodulation function, a detector circuit, an amplifier circuit, and a rectifier circuit may be provided on the second coil 123 side.

Figure 10B:
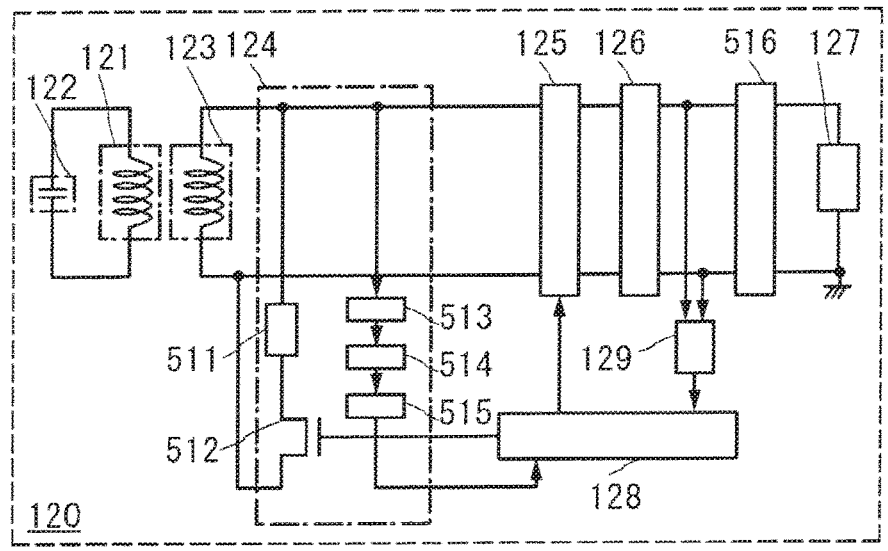

FIG. 10B is a diagram that specifically illustrates the unit of the second transmission-reception circuit 124 in FIG. 1. In the second transmission-reception circuit 124 in FIG. 10B, a load modulator 511 and a modulation transistor 512 that serve as a modulation circuit are provided on the second coil 123 side. Moreover, in the second transmission-reception circuit 124 in FIG. 10B, a detector circuit 513, an amplifier circuit 514, and a rectifier circuit 515 that serve as a demodulation circuit are provided on the second coil 123 side.

The second matching circuit 125 is connected to the second coil 123 through the second transmission-reception circuit 124 and connected to the rectifier circuit 126. The second matching circuit 125 includes at least one element that can adjust the impedance and is connected in series and/or in parallel with the load 127. The operation of the second matching circuit 125 is controlled by the second control circuit 128 so as to match the impedance between the second coil 123 side, which is the input side, and the rectifier circuit 126 side, which is the output side.

Note that the second matching circuit 125 preferably has the same structure as the first matching circuit 112. For example, when an element connected in series with the high frequency power source 111 is a variable capacitor the first matching circuit 112, a corresponding element in the second matching circuit 125 is preferably a variable capacitor. Without limitation to a variable capacitor, the same can be applied to a variable coil.

The rectifier circuit 126 is a circuit for rectifying an alternating-current signal received by the second coil 123 to a direct-current signal. The rectifier circuit 126 includes a diode, for example. Moreover, the rectifier circuit including a diode may be a full-wave rectifier circuit or a half-wave rectifier circuit; and may be constituted by circuit using a diode bridge, a full-wave rectifier circuit using a transformer, or the like.

The load 127 is any element that operates by receiving power wirelessly. Examples of the load 127 are a battery and an electric motor. Specific examples thereof are electronic device that operates with a battery, such as a mobile phone, and an electric propulsion vehicle. Note that as illustrated in FIG. 10B, a DCDC converter 516 for converting a direct-current voltage obtained by receiving the first wireless signal by the second coil 123 into a voltage used in the load 127 may be provided between the load 127 and the rectifier circuit 126 in the power reception device 120.

The second control circuit 128 is a circuit for controlling the second matching circuit 125 in accordance with data included in the first wireless signal received by the second transmission-reception circuit 124. Moreover, the second control circuit 128 is a circuit for outputting a signal on the value of power received from the power feeding device 110, from the second transmission-reception circuit 124. The signal on the value of power is transmitted as the second wireless signal, in accordance with the product of a voltage value and a current value, that is, a power value based on an alternating-current signal from the power feeding device 110. The power value is detected by the received power detection circuit 129.

The received power detection circuit 129 is a circuit for detecting transmission efficiency of power transmitted from the power feeding device 110 to the power reception device 120. For example, the received power detection circuit 129 may include an A/D converter circuit and monitor a voltage value and a current value of an alternating-current signal received by the power reception device 120 to estimate a value of power from the power feeding device 110. The voltage value obtained in the received power detection circuit 129 is converted from an analog signal into a digital signal and can be detected in the second control circuit 128.

FIGS. 2A to 2D illustrate examples of circuit configurations of the first matching circuit 112 and the second matching circuit 125. FIGS. 2A to 2D each show the configuration of a matching circuit applicable to the first matching circuit 112 and the second matching circuit 125. In FIGS. 2A to 2D, a matching circuit 200 represents each of the first matching circuit 112 and the second matching circuit 125, an input circuit 241 represents a circuit on the input side, such as the high frequency power source 111; and an output circuit 242 represents a circuit on the output side, such as the first coil 114. Moreover, a control circuit 203 represents each of the first control circuit 115 and the second control circuit 128.

Figure 2A:
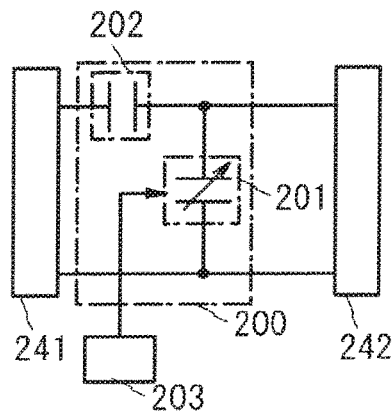
FIGS. 2A to 2D each illustrate a structure in Embodiment 1.
Figure 2B:
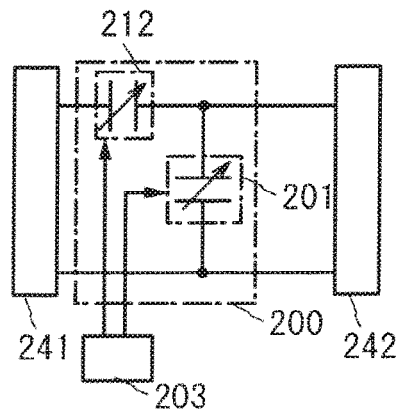

FIG. 2A illustrates the matching circuit 200 that includes a variable capacitor 201 connected in parallel with the input circuit 241 and the output circuit 242, and a capacitor 202 connected in series with the input circuit 241 and the output circuit 242. The capacitance of the variable capacitor 201 is controlled by the control circuit 203. FIG. 2B illustrates the matching circuit 200 that includes the variable capacitor 201 connected in parallel with the input circuit 241 and the output circuit 242, and a variable capacitor 212 connected in series with the input circuit 241 and the output circuit 242. The capacitances of the variable capacitors 201 and 212 are controlled by the control circuit 203.

Figure 2C:
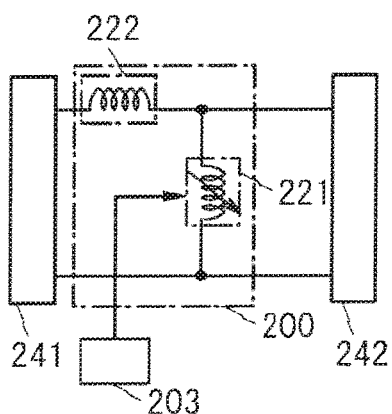
Figure 2D:
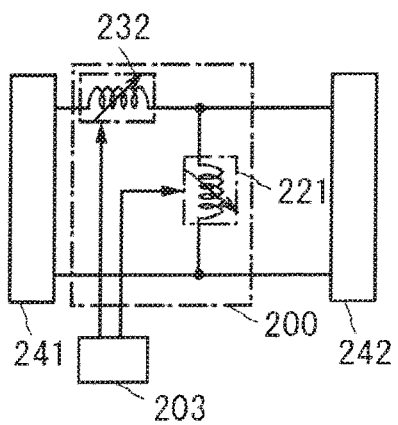

FIG. 2C illustrates the matching circuit 200 that includes a variable coil 221 connected in parallel with the input circuit 241 and the output circuit 242, and a coil 222 connected in series with the input circuit 241 and the output circuit 242. The inductance of the variable coil 221 is controlled by the control circuit 203. FIG. 2D illustrates the matching circuit 200 that includes the variable coil 221 connected in parallel with the input circuit 241 and the output circuit 242, and a variable coil 232 connected in series with the input circuit 241 and the output circuit 242. The inductances of the variable coils 221 and 232 are controlled by the control circuit 203.

Note that the first matching circuit 112 and the second matching circuit 125 preferably have the same structure. For example, when an element connected in series with the high frequency power source 111 is a variable capacitor in the first matching circuit 112, a corresponding element in the second matching circuit 125 is preferably a variable capacitor. Without limitation to as variable capacitor, the same can be applied to a variable coil.

Figure 9A:
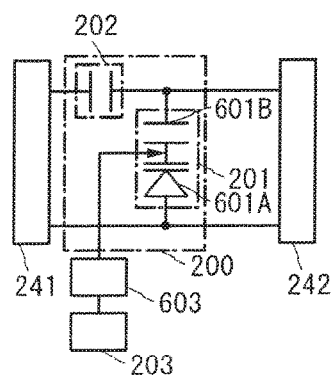
FIGS. 9A to 9C each illustrate a structure in Embodiment 1.
Figure 9B:
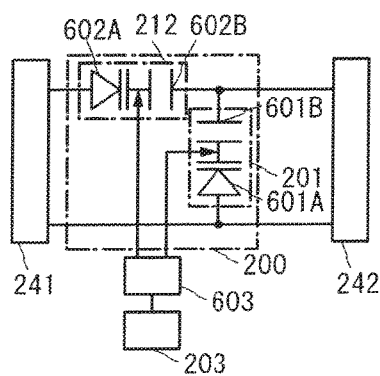

FIGS. 2A and 2B each show the configuration of the matching circuit in which a variable capacitor is used and electrostatic capacitance is controlled by the control circuit 203. Here, specific configurations of variable capacitors will be described. FIG. 9A illustrates a configuration in which a variable capacitance diode (also referred to as a varicap diode) 601A and a capacitor 601B are included as the variable capacitor 201 in FIG. 2A. FIG. 9B illustrates a configuration in which the variable capacitance diode 601A and the capacitor 601B are included as the variable capacitors 201, and a variable capacitance diode 602A and a capacitor 602B are included as the variable capacitor 212 in FIG. 2B. The variable capacitor including the variable capacitance diode is controlled by the control circuit through a D/A converter 603. Note that the variable capacitor is not limited to using a variable capacitance diode, and can have a structure in which a plurality of capacitors connected to a switch are connected in parallel with each other and electrostatic capacitance is controlled by controlling switching of the switch. Moreover, the variable capacitor can have a structure in which a rotary variable capacitor is mechanically controlled using an electric motor or the like so that electrostatic capacitance is variable.

Figure 9C:
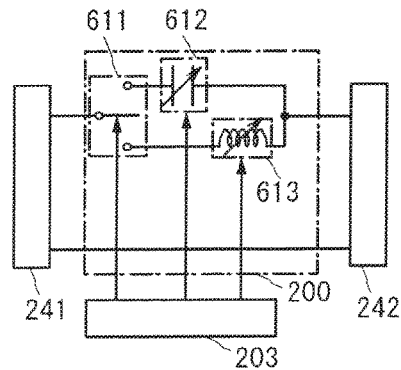

Note that in the configuration of the matching circuit illustrated in any of FIG. 2A to 2D, it is possible that connection is switched between a variable capacitor and a variable coil and electrostatic capacitance is controlled by the control circuit 203. FIG. 9C illustrates a configuration in which a switch 611 switches the connection between a variable capacitor 612 and a variable coil 613. By switching the switch 611 by the control circuit 203 as illustrated in FIG. 9C, the capacitance of the variable capacitor 612 and the inductance of the variable coil 613 can be switched to be controlled.

In the following description of this embodiment, a description is given of the case where the first matching circuit 112 includes a variable capacitor (Cs) connected in series with the high frequency power source 111, and a variable capacitor (Cp) connected in parallel with the high frequency power source 111; and the second matching circuit 125 includes a variable capacitor (Cs) connected in series with the load 127, and a variable capacitor (Cp) connected in parallel with the load 127.

In a resonant wireless power feeding system, the condition in which the power transmission efficiency is at the maximum varies depending on the distance between the first resonant coil 116 in the power feeding device 110 and the second resonant coil 121 in the power reception device 120. Therefore, in the structure in this embodiment, a parameter of the first matching circuit 112 and a parameter of the second matching circuit 125 are changed so that the power transmission efficiency is maximized depending on the distance between the power feeding device 110 and the power reception device 120. Note that a signal on a parameter set (composed of the parameters of the first matching circuit 112 and the second matching circuit 125 with which the power transmission efficiency is at the maximum) corresponds to the data signal described using FIG. 1.

Note that the parameter of the first matching circuit 112 refers to the impedance of the variable capacitor or the variable coil included in the first matching circuit 112. The parameter of the second matching circuit 125 refers to the impedance of the variable capacitor or the variable coil included in the second matching circuit 125. The distance between the power feeding device 110 and the power reception device 120 refers to the distance between the first resonant coil 116 and the second resonant coil 121.

Table 1 is a table where the parameters of the first matching circuit 112 and the second matching circuit 125 are set so that the power transmission efficiency is at the maximum depending on the distance between the power feeding device 110 and the power reception device 120.

TABLE 1

| No. | Parameter of first matching circuit | Parameter of second matching circuit | Distance between power feeding device and power reception device |
|---|---|---|---|
| 0 | (Cs00, Cp00) | (Cs10, Cp10) | D0 |
| 1 | (Cs01, Cp01) | (Cs11, Cp11) | D1 |
| 2 | (Cs02, Cp02) | (Cs12, Cp12) | D2 |
| . | . | . | . |
| . | . | . | . |
| . | . | . | . |
| j | (Cs0j, Cp0j) | (Cs1j, Cp1j) | Dj |
| . | . | . | . |
| . | . | . | . |
| . | . | . | . |
| . | . | . | . |
| n | (Cs0n, Cp0n) | (Cs1n, Cp1n) | Dn |

The data of the parameters set shown in Table 1 is provided to be able to be read by the first control circuit 115 or the second control circuit 128. In this specification, a description is given below assuming that the first control circuit 115 in the power feeding device 110 includes the data in Table 1.

In Table 1, the parameter of the first matching circuit 112, the parameter of the second matching circuit 125, and the distance between the power feeding device 110 and the power reception device 120 correspond to one parameter set, to which a number is given. Note that No. 0 indicates an initial state of the first matching circuit 112 and the second matching circuit 125.

Figure 3:
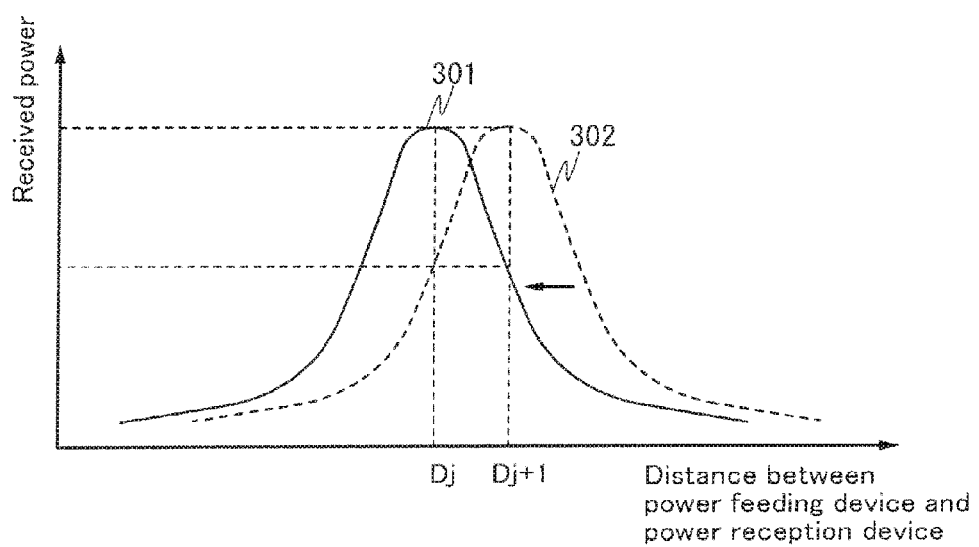
FIG. 3 is a graph illustrating Embodiment 1.

FIG. 3 shows the relation between distance between the power feeding device 110 and the power reception device 120 and received power. A solid line curve 301 in FIG. 3 shows the relation between distance between the power feeding device 110 and the power reception device 120 and transmission efficiency in the j-th parameter set. A dotted curve 302 in FIG. 3 shows the relation between distance between the power feeding device 110 and the power reception device 120 and transmission efficiency in the (j+1)th parameter set. Note that the transmission efficiency is the power transmission efficiency between the power feeding device and the power reception device and can be represented by an $S_{21}$ parameter.

For example, in the case where the parameter of the first matching circuit 112 is set to Cs0j and Cp0j and the parameter of the second matching circuit 125 is set to Cs1j and Cp1j in the j-th parameter set as shown in Table 1, the maximum power transmission efficiency is obtained when the distance between the power feeding device 110 and the power reception device 120 is Dj (see the solid line curve 301 in FIG. 3). In other words, in the case where the distance between the power feeding device 110 and the power reception device 120 is Dj, the power transmission efficiency is not maximized when the parameter of the first matching circuit 112 is not set to Cs0j and Cp0j and the parameter of the second matching circuit 125 is not set to Cs1j and Cp1j.

For example, in the case where the parameters of the first matching circuit 112 and the second matching circuit 125 are set to Cs0j, Cp0j, Cs1j, and Cp1j, the power transmission efficiency is not maximized when the distance between the power feeding device 110 and the power reception device 120 is Dj+1 (see the dotted curve 302 in FIG. 3). By setting the parameters of the first matching circuit 112 and the second matching circuit 125 to Cs1j+1, Cp0j+1, Cs1j+1, and Cp1j+1, the power transmission efficiency is at the maximum when the distance between the power feeding device 110 and the power reception device 120 is Dj+1 (see the dotted curve 302 in FIG. 3).

Figure 6:
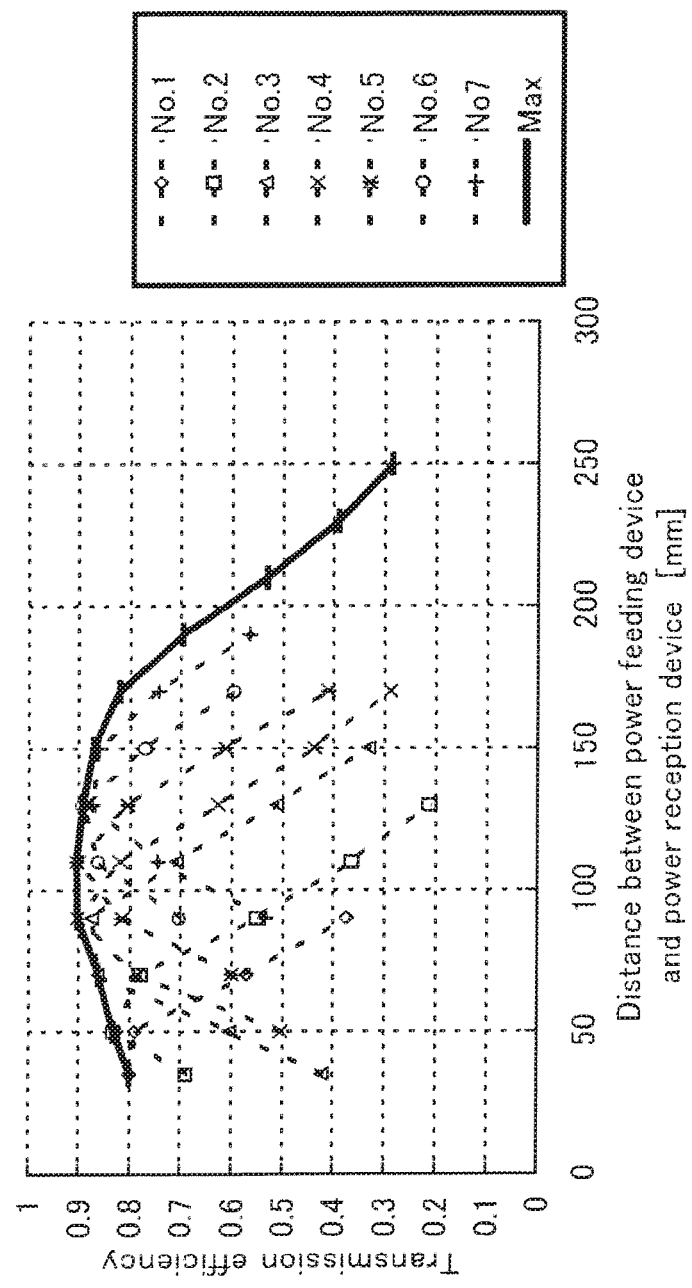
FIG. 6 is a graph illustrating Embodiment 1.

FIG. 6 shows the actual relation between distance between the power feeding device 110 and the power reception device 120 and transmission efficiency when the parameters of the first matching circuit 112 and the second matching circuit 125 are set such that Cs ranges from 0 to 1000 pF and Cp ranges from 0 to 150 pF. In Table 2 corresponding to FIG. 6, the parameter of the first matching circuit 112, the parameter of the second matching circuit 125, and the distance with which the power transmission efficiency is at the maximum between the power feeding device 110 and the power reception device 120 are set. Note that the data in FIG. 6 corresponds to Table 2.

TABLE 2

| No. | Parameter of first matching circuit (pF) | Parameter of second matching circuit (pF) | Distance between power feeding device and power reception device |
|---|---|---|---|
| 1 | (150, 150) | (150, 150) | 35 |
| 2 | (200, 150) | (200, 150) | 50 |
| 3 | (300, 100) | (300, 100) | 70 |
| 4 | (300, 50) | (300, 50) | 85 |
| 5 | (300, 0) | (300, 0) | 110 |
| 6 | (500, 0) | (500, 0) | 130 |
| 7 | (1000, 0) | (1000, 0) | 150 |

By setting the parameter set as shown in FIG. 6 and Table 2, the transmission efficiency can be maximized in accordance with the distance between the power feeding device and the power reception device. Particularly at short distance, a reduction in transmission efficiency caused by splitting of the peak of power transmission efficiency can be suppressed.

Figure 4:
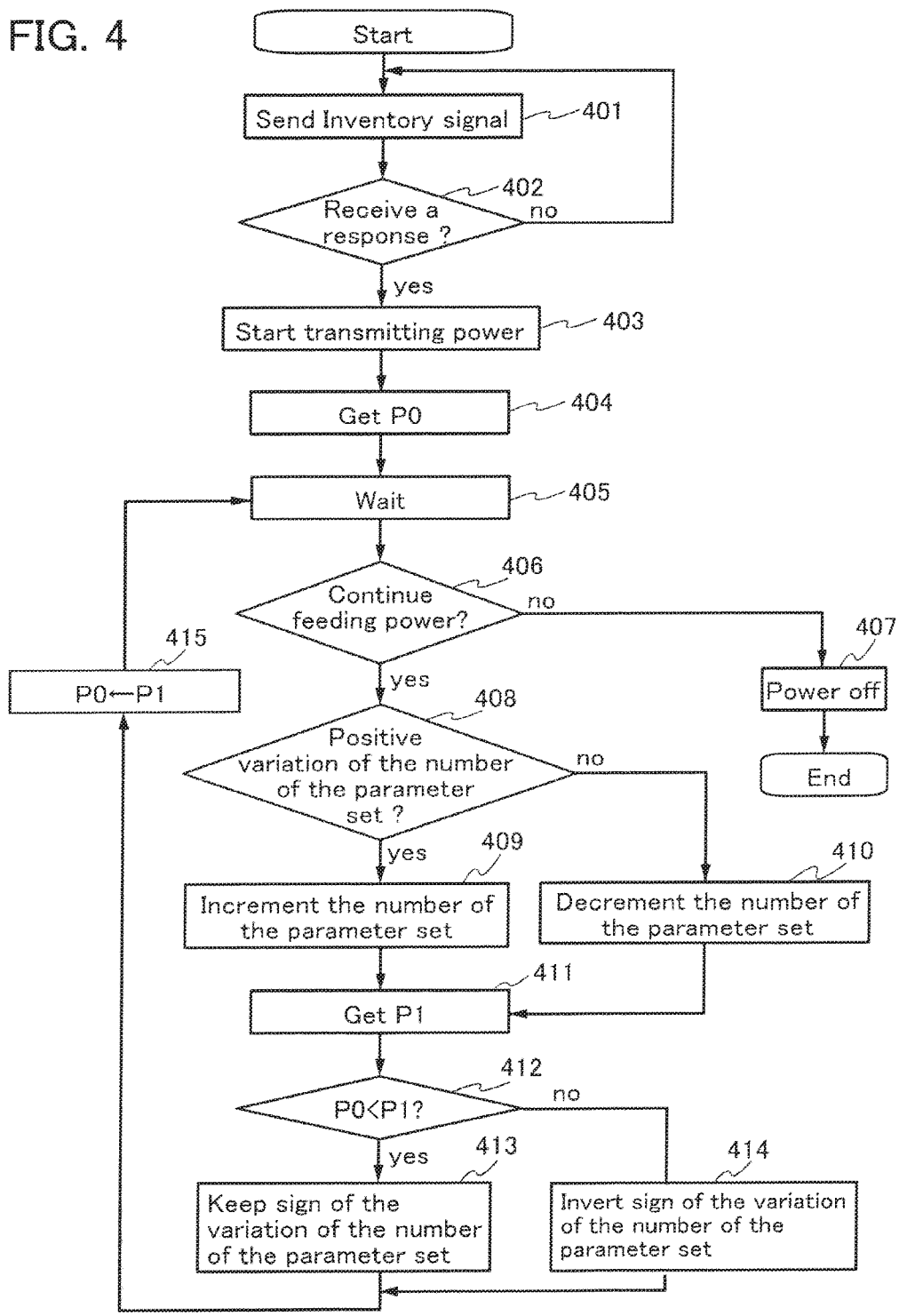
FIG. 4 is a flow chart illustrating Embodiment 1.

Next, a description is given of a method for supplying power in a wireless power feeding system according to one embodiment of the present invention. FIG. 4 is a flow chart showing an example of a method for supplying power in a wireless power feeding system.

The power feeding device 110 intermittently transmits an inventory signal as the first wireless signal superimposed on an alternating-current signal of the high frequency power source (see Step 401 in FIG. 4). The power feeding device 110 repeats transmission of the inventory signal until the power reception device 120 is positioned in an appropriate position and the power feeding device 110 receives the second wireless signal for responding to the inventory signal (see Step 402 in FIG. 4). When it is determined that power reception device 120 is positioned in a position where power can be transmitted thereto, the process proceeds to the next step.

Then, after the power reception device 120 is positioned in an appropriate position, the power feeding device 110 starts wireless power transmission to the power reception device 120 continuously with the use of an alternating-current signal of the high frequency power source (see Step 403 in FIG. 4). Since the parameter of the first matching circuit 112 in the power feeding device 110 and the parameter of the second matching circuit 125 in the power reception device 120 are in the initial state (e.g., the 0-th parameter set in Table 1) at this time, power transmission with high transmission efficiency is not always performed at this stage.

Note that in this embodiment, a description is given of the case where the number of the selected parameter set is incremented front No. 1.

Upon the start of power transmission from the power feeding device 110 to the power reception device 120, the alternating-current signal is transmitted from the first resonant coil 116 in the power feeding device 110 to the second resonant coil 121 in the power reception device 120 by resonant inductive coupling, and converted into a direct-current signal by the rectifier circuit 126 and applied to the load 127. At this time, the second control circuit 128 in the power reception device 120 detects a voltage value and a current value of a direct current signal rectified from an alternating-current signal received by the power reception device 120, using the received power detection circuit 129 in accordance with the first wireless signal that is transmitted from the power feeding device 110 and requests the power reception device 120 to send back the power value received by the power reception device 120 to the power feeding device 110 (see Step 404 in FIG. 4). The product of the voltage value and current value at this time is denoted by a power value P0. Data on the product of the voltage value and current value. (the power value P0) is transmitted using the second wireless signal to the first control circuit 115 as a signal on the value of power received by the power reception device 120 from the power feeding device 110 in accordance with an instruction on the power feeding device 110. Note that data on the product of the voltage value and current value (the power value P0) may be stored once in a storage device (not shown) connected to the second control circuit 128.

Next, power is charged (or supplied) to the load 127 in the power reception device 120 in a wait state in a given period (e.g., 300 ms) (see Step 405 in FIG. 4).

Then, the first control circuit 115 determines whether to continue charging of the load 127 depending on the charging state of the load 127 (see Step 406 in FIG. 4). When it is determined that charging of the load 127 is not to be continued, charging is completed by turning off the high frequency power source 111 (see Step 407 in FIG. 4). When it is determined that charging of the load 127 is to be continued, the process proceeds to the next step.

Next, the first control circuit 115 determines whether to increment or decrement (whether to select positive variation or negative variation of) the number of the parameter set (see Step 408 in FIG. 4). When it is determined that the parameter set is not incremented, an instruction to decrement the number of the parameter set is output to the first matching circuit 112 and the second matching circuit 125 (see Step 410 in FIG. 4). When it is determined that the parameter set is incremented, an instruction to increment the number of the parameter set is output to the first matching circuit 112 and the second matching circuit 125 (see Step 409 in FIG. 4). In order to output such an instruction from the first control circuit 115 to the second matching circuit 125, a data signal is output to the first transmission reception circuit 113, and the first wireless signal is transmitted from the first transmission-reception circuit 113 to the second transmission-reception circuit 124 in the power reception device 120 and then output to the second matching circuit 125 through the second control circuit 128. After receiving the first wireless signal, the power reception device 120 transmits a signal for answering the power feeding device that the power reception device 120 has received the data signal, as the second wireless signal.

Then, after the parameter set is incremented or decremented, the second control circuit 128 detects a voltage value and a current value in accordance with a signal for requesting the power reception device 120 to send back the power value received by the power reception device 120 to the power feeding device 110 by using the received power detection circuit 129 (see Step 411 in FIG. 4). The product of the voltage value and current value at this time is denoted by a power value P1. Data on the product of the voltage value and current value (the power value P1) is transmitted using the second wireless signal to the first control circuit 115 as a signal on the value of power received by the power reception device 120 from the power feeding device 110 in accordance with the instruction on the power feeding device 110 side. Data on the product of the voltage value and current value (the power value P1) may be stored once in the storage device (not shown) connected to the second control circuit 128.

Next, the first control circuit 115 determines whether the power value P1 is larger than the power value P0 (see Step 412 in FIG. 4). When the first control circuit 115 determines that the power value P1 is smaller than the power value P0, an instruction to invert a sign of the variation of the number of the parameter set is output from the first control circuit 115 to the second matching circuit 125 (see Step 414 in FIG. 4). When the first control circuit 115 determines that the power value P1 is larger than the power value P0, an instruction to keep the sign of the variation of the number of the parameter set is output to the first matching circuit 112 and the second matching circuit 125 (see Step 413 in FIG. 4). In order to output such an instruction from the first control circuit 115 to the second matching circuit 125, a data signal is output to the first transmission-reception circuit 113, and the first wireless signal is transmitted from the first transmission-reception circuit 113 to the second transmission-reception circuit 124 in the power reception device 120 and then output to the second matching circuit 125 through the second control circuit 128. After receiving the first wireless signal, the power reception device 120 transmits a signal for answering the power feeding device that the power reception device 120 has received the data signal, as the second wireless signal.

Then, the first control circuit 115 substitutes the power value P1 into the power value P0 (see Step 415 in FIG. 4). After that, the process returns to Step 405, and the subsequent steps are repeated. In other words, a series of steps from Step 405 to Step 415 is repeated until charging of the load 127 is completed.

For example, the assumption is made that a series of Steps 405 to 415 is repeated, and the first control circuit 115 obtains the product of a voltage value and a current value of the (j−1)th parameter set (P0=Wj−1), and then increments the number of the parameter set and obtains the product of a voltage value and a current value of the j-th parameter set (P1=Wj) (see Step 411 in FIG. 4).

Then, the first control circuit 115 determines whether the power value P1 is larger than the power value P0 (see Step 412 in FIG. 4). When the power value P1 is determined to be larger than the power value P0 (Wj>Wj−1), an instruction to keep the sign of the variation of the number of the parameter set is output from the first control circuit 115 to the first matching circuit 112 and the second matching circuit 125 (see Step 413 in FIG. 4).

Then, the power value P1 is substituted into the power value P0 in the first control circuit 115 (see. Step 415 in FIG. 4), so that P0 becomes equal to Wj and the load 127 is charged for a given period (see Step 405 in FIG. 4).

Then, the first control circuit 115 determines whether to continue charging of the load 127, and when the first control circuit 115 determines that charging is continued (Step 406 in FIG. 4), the process proceeds to Step 408.

Next, the first control circuit 115 determines whether to increment or decrement (whether to select positive variation or negative variation of) the number of the parameter set (see Step 408 in FIG. 4). Here, since it is determined in Step 411 that P0<P1 is satisfied by incrementing the number of the parameter set from No. j−1 to No. j, the first control circuit 115 outputs an instruction to increment the number of the parameter set from No. j to No. j+1 to the first matching circuit 112 and the second matching circuit 125 (see Step 409 in FIG. 4).

Then, the second control circuit 128 obtains a voltage value and a current value of the (j+1)th parameter set (see Step 411 in FIG. 4). The product of the voltage value and current value at this time is represented as follows: the power value P1=Wj+1.

Next, the first control circuit 115 determines whether the power value P1 is larger than the power value P0 (see Step 412 in FIG. 4). When the power value P1 is determined to be smaller than the power value P0 (Wj<Wj+1), an instruction to invert the sign of the variation of the number of the parameter set is output to the first matching circuit 112 and the second matching circuit 125 (see Step 414 in FIG. 4).

Then, the power value P1 is substituted into the power value P0 in the first control circuit 115 (Step 415 in FIG. 4), so that P0 becomes equal to Wj+1 and the load 127 is charged for a given period (Step 405 in FIG. 4).

Figure 5:
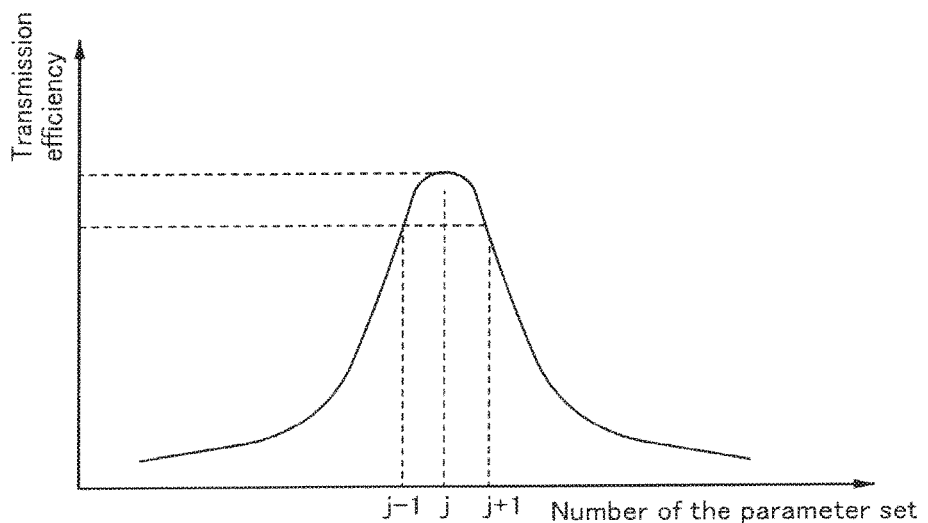
FIG. 5 is a graph illustrating Embodiment 1.

FIG. 5 shows the relation between the above-described parameter set numbers and transmission efficiency. As shown in FIG. 5, the transmission efficiency is at the maximum in the j-th parameter set, in which ease power can be efficiently supplied from the power feeding device 110 to the power reception device 120. By successively incrementing and decrementing the number of the parameter set between j−1 and j+1 repeatedly until charging of the load 127 is completed, the load 127 can be efficiently charged.

In addition, even if the distance between the power feeding device 110 and the power reception device 120 is changed while the load 127 is charged, the parameter set can be kept shifting until charging of the load 127 is completed, whereby the load 127 can be efficiently charged.

By employing the power feeding method shown in FIG. 4, the wireless power feeding system in FIG. 1 can provide high power transmission efficiency between the power feeding device 110 and the power reception device 120 without dynamically controlling the oscillation frequency in accordance with the positional relation between the power feeding device and the power reception device.

This embodiment can be implemented in appropriate combination with the structures described in another embodiment.

Embodiment 2

In this embodiment, applications of the wireless power feeding system described in Embodiment 1 will be described. Examples of applications of the wireless power feeding system according to one embodiment of the present invention are portable electronic devices, such as a digital video camera, a portable information terminal (e.g., a mobile computer, a mobile phone, a portable game machine, and an e-book reader), and an image reproducing device including a recording medium (specifically a digital versatile disc (DVD)). In addition, an electric propulsion vehicle that is powered by electric power, such as an electric car, can be given. Examples will be described below with reference to drawings.

Figure 7A:
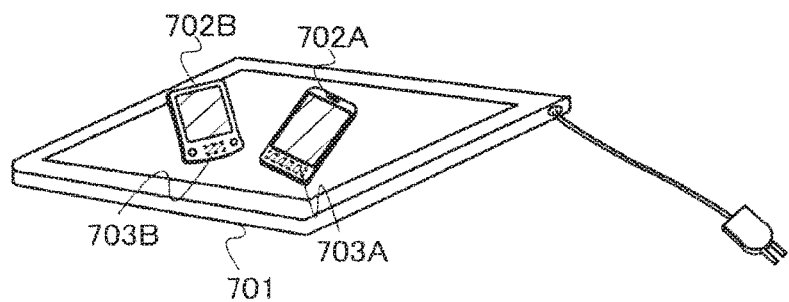
FIGS. 7A and 7B are diagrams illustrating Embodiment 2.

FIG. 7A illustrates an example of an application of the wireless power feeding system to a mobile phone and a portable information terminal. A power feeding device 701, a mobile phone 702A including a power reception device 703A, and a mobile phone 702B including a power reception device 703B are shown. The wireless power feeding system described in Embodiment 1 can be applied between the power feeding device 701 and the power reception device 703A and between the power feeding device 701 and the power reception device 703B.

For example, the power feeding device 701 can have the configuration of the power feeding device 110 in Embodiment 1, and the power reception devices 703A and 703B can have the configuration of the power reception device 120 in Embodiment 1.

The use of the wireless power feeding system according to one embodiment of the present invention can increase power transmission efficiency in accordance with the positional relation between the power feeding device 701 and the power reception device 703A and between the power feeding device 701 and the power reception device 703B. Consequently, the power feeding device 701 can efficiently supply power to the power reception devices 703A and 703B.

Figure 7B:
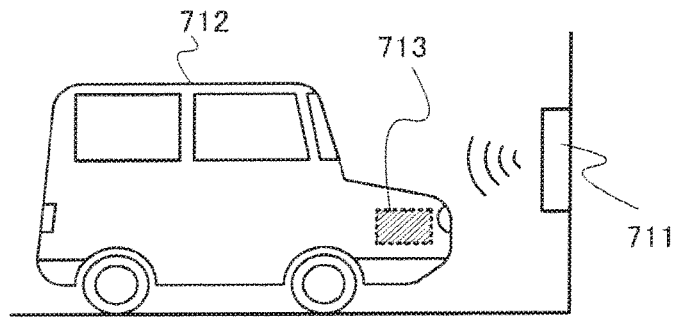

FIG. 7B illustrates an example of an application of the wireless power feeding system to an electric car which is an electric propulsion vehicle. A power feeding device 711 and an electric car 712 including a power reception device 713 are shown. The wireless power feeding system in Embodiment 1 can be applied between the power feeding device 711 and the power reception device 713.

For example, the power feeding device 711 can have the configuration of the power feeding device 110 in Embodiment 1, and the power reception device 713 can have the configuration of the power reception device 120 in Embodiment 1.

The use of the wireless power feeding system according to one embodiment of the present invention can increase power transmission efficiency in accordance with the positional relation between the power feeding device 711 and the power reception device 713. Consequently, the power feeding device 711 can efficiently supply power to the power reception device 713.

As described above, the wireless power feeding system described in Embodiment 1 can be used for any object that is driven with power.

This embodiment can be implemented in appropriate combination with the structures described in the other embodiment.

This application is based on Japanese Patent Application serial No. 2011-009685 filed with Japan Patent Office on Jan. 20, 2011, the entire contents of which are hereby incorporated by reference.

What is claimed is:

1. A wireless power reception device comprising:
   a second resonant coil configured to resonate with a first resonant coil of a wireless power feeding device;
   a coil;
   a rectifier circuit electrically connected to the coil;
   a matching circuit configured to match impedance between the rectifier circuit and the coil; and
   a battery electrically connected to the coil.

2. The wireless power reception device e according to claim 1, further comprising:

a transmission-reception circuit configured to demodulate a first wireless signal from the wireless power feeding device and generate a second wireless signal; and a control circuit configured to generate a data of the second wireless signal including a power value received from the wireless power feeding device, wherein the matching circuit is configured to match impedance between the rectifier circuit and the coil in accordance with a data signal of the first wireless signal, the data signal including parameters of the matching circuit.

3. The wireless power reception device according to claim 2, wherein the transmission-reception circuit comprises a load modulator configured to apply load modulation to an alternating-current signal output from the wireless power feeding device.

4. The wireless power reception device according to claim 2, wherein the matching circuit comprises a variable capacitor whose capacitance is controlled by the control circuit.

5. The wireless power reception device according to claim 2, wherein the matching circuit comprises a variable coil whose inductance is controlled by the control circuit.

6. The wireless power reception device according to claim 2, further comprising a received power detection circuit configured to detect the power value received by the wireless power reception device.

* * * * *